United States Patent
Kang et al.

(10) Patent No.: US 11,270,923 B2
(45) Date of Patent: *Mar. 8, 2022

(54) SEMICONDUCTOR PACKAGES INCLUDING A HEAT INSULATION WALL

(71) Applicant: SK hynix Inc., Icheon-si (KR)

(72) Inventors: Min Kyu Kang, Seoul (KR); Jae Hyun Son, Gwangju-si (KR); Ji Hyeok Shin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 154 days.

This patent is subject to a terminal disclaimer.

(21) Appl. No.: 16/789,063

(22) Filed: Feb. 12, 2020

(65) Prior Publication Data

US 2020/0185298 A1 Jun. 11, 2020

Related U.S. Application Data

(63) Continuation of application No. 15/979,752, filed on May 15, 2018, now Pat. No. 10,600,713.

(30) Foreign Application Priority Data

Oct. 27, 2017 (KR) .......................... 10-2017-0141341

(51) Int. Cl.
*H01L 23/34* (2006.01)
*H01L 23/367* (2006.01)
(Continued)

(52) U.S. Cl.
CPC ............ *H01L 23/367* (2013.01); *H01L 23/16* (2013.01); *H01L 23/3121* (2013.01); *H01L 23/3128* (2013.01); *H01L 23/3737* (2013.01); *H01L 23/4334* (2013.01); *H01L 25/03* (2013.01); *H01L 25/0652* (2013.01);
(Continued)

(58) Field of Classification Search
CPC . H01L 2224/73265; H01L 2224/32145; H01L 2224/32225; H01L 2224/48145; H01L 2224/13099; H01L 2224/48227; H01L 2224/16225; H01L 2224/16227; H01L 2224/73253; H01L 2225/06506; H01L 2225/06517; H01L 2225/0652; H01L 2225/06562; H01L 2225/06589;
(Continued)

(56) References Cited

U.S. PATENT DOCUMENTS 6,297,074 B1 * 10/2001 Miyano ............. H01L 23/49572
438/109
10,600,713 B2 * 3/2020 Kang ...................... H01L 25/03
(Continued)

FOREIGN PATENT DOCUMENTS

| KR | 1020110004119 A | 1/2011 |
| KR | 1020140106038 A | 9/2014 |
| KR | 101633238 B1 | 6/2016 |

*Primary Examiner* — Theresa T Doan
(74) *Attorney, Agent, or Firm* — William Park & Associates Ltd.

(57) ABSTRACT

A semiconductor package includes a first semiconductor chip and a second semiconductor chip which are disposed side-by-side on a surface of a package substrate. A heat insulation wall is disposed between the first semiconductor chip and the second semiconductor chip. The heat insulation wall thermally isolates the first semiconductor chip from the second semiconductor chip.

11 Claims, 6 Drawing Sheets

(51) Int. Cl.
*H01L 25/065* (2006.01)
*H01L 23/31* (2006.01)
*H01L 25/18* (2006.01)
*H01L 25/03* (2006.01)
*H01L 23/373* (2006.01)
*H01L 23/433* (2006.01)
*H01L 23/16* (2006.01)

(52) U.S. Cl.
CPC ...... *H01L 25/0655* (2013.01); *H01L 25/0657* (2013.01); *H01L 25/18* (2013.01); *H01L 2224/16225* (2013.01); *H01L 2224/32145* (2013.01); *H01L 2224/32225* (2013.01); *H01L 2224/48091* (2013.01); *H01L 2224/48145* (2013.01); *H01L 2224/73253* (2013.01); *H01L 2224/73265* (2013.01); *H01L 2225/0651* (2013.01); *H01L 2225/0652* (2013.01); *H01L 2225/06506* (2013.01); *H01L 2225/06517* (2013.01); *H01L 2225/06562* (2013.01); *H01L 2225/06589* (2013.01); *H01L 2924/15311* (2013.01)

(58) Field of Classification Search
CPC ... H01L 23/16; H01L 23/3121; H01L 23/367; H01L 23/3737; H01L 23/4334; H01L 24/32
USPC ......................................................... 257/712
See application file for complete search history.

(56) References Cited

U.S. PATENT DOCUMENTS

| | | | |
|---|---|---|---|
| 2002/0180023 A1 | 12/2002 | Her et al. | |
| 2009/0057874 A1 | 3/2009 | Syri et al. | |
| 2009/0206444 A1* | 8/2009 | Yamada | H01L 25/0655 257/506 |
| 2014/0097532 A1 | 4/2014 | Chiang et al. | |
| 2014/0133105 A1* | 5/2014 | Yee | H01L 23/49822 361/720 |
| 2014/0264799 A1 | 9/2014 | Gowda et al. | |
| 2015/0311182 A1* | 10/2015 | Lee | H01L 23/562 257/734 |
| 2017/0206937 A1 | 7/2017 | Chang et al. | |

* cited by examiner

SEMICONDUCTOR PACKAGES INCLUDING A HEAT INSULATION WALL

CROSS-REFERENCE TO RELATED APPLICATIONS

The present application is a continuation application of Ser. No. 15/979,752, filed on May 15, 2018, and claims priority under 35 U.S.C 119(a) to Korean Application No. 10-2017-0141341, filed on Oct. 27, 2017, which is incorporated herein by reference in its entirety.

BACKGROUND

1. Technical Field

The present disclosure relates to semiconductor package technologies and, more particularly, to semiconductor packages including a heat insulation wall that thermally isolates one semiconductor chip from another semiconductor chip.

2. Related Art

Various kinds of semiconductor chips may be employed in a single semiconductor package. The semiconductor chips employed in a single semiconductor package may have different functions. That is, the semiconductor chips employed in a single semiconductor package may consume electric power differently. Accordingly, quantities of heat generated by the semiconductor chips in a single semiconductor package may also be different from each other.

A high power semiconductor chip consuming relatively high electric power may generate a relatively large amount of heat as compared with a low power semiconductor chip consuming relatively low electric power. The heat generated by the high power semiconductor chip may be conducted to the low power semiconductor chip which is adjacent to the high power semiconductor chip. In such a case, performance of the low power semiconductor chip may be degraded due to the heat generated by the high power semiconductor chip. Thus, in the event that at least two different kinds of semiconductor chips are embedded in a single semiconductor package, it may be necessary to develop techniques for controlling or treating heat distribution and heat conduction in the single semiconductor package.

SUMMARY

According to an embodiment, there is provided a semiconductor package. The semiconductor package includes a first package substrate, a built-in package disposed on the first package substrate and configured to include a first semiconductor chip and a heat insulation wall for thermally isolating the first semiconductor chip, and a second semiconductor chip disposed on the first package substrate to be spaced apart from the built-in package.

According to another embodiment, there is provided a semiconductor package. The semiconductor package includes a first semiconductor chip and a second semiconductor chip disposed side-by-side on a surface of a package substrate to be spaced apart from each other, a first molding layer covering the first semiconductor chip, a second molding layer covering the second semiconductor chip, and a heat insulation wall disposed between the first molding layer and the second molding layer to thermally isolate the first semiconductor chip.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
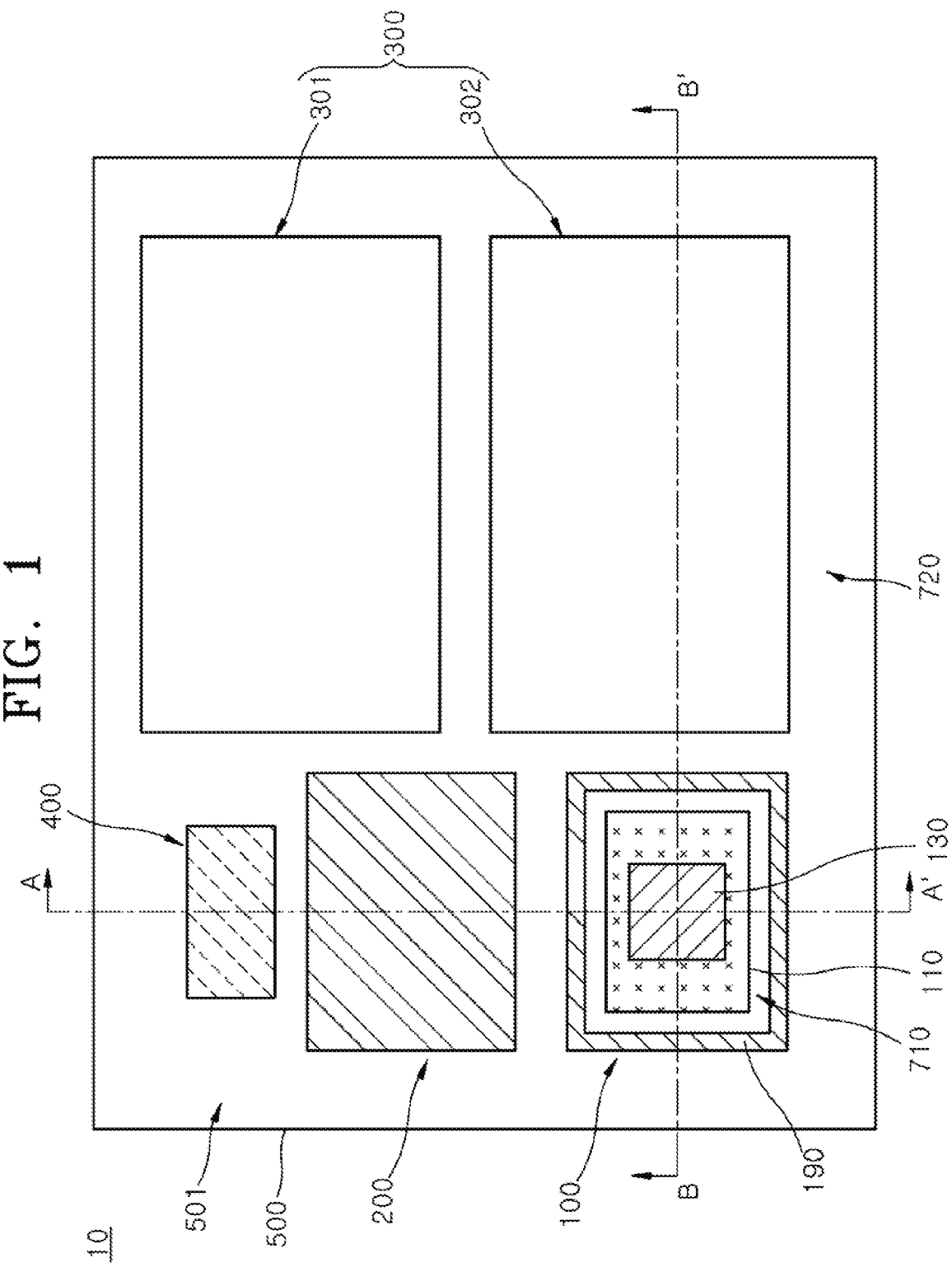
FIG. 1 is a plan view illustrating a semiconductor package according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein may have the same meaning as commonly understood by one of ordinary skill in the art to which the embodiments belong.

It will be understood that although the terms "first," "second," "third", etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside", another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom", and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Various embodiments of the present disclosure will be described hereinafter with reference to the accompanying drawings. Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 2:
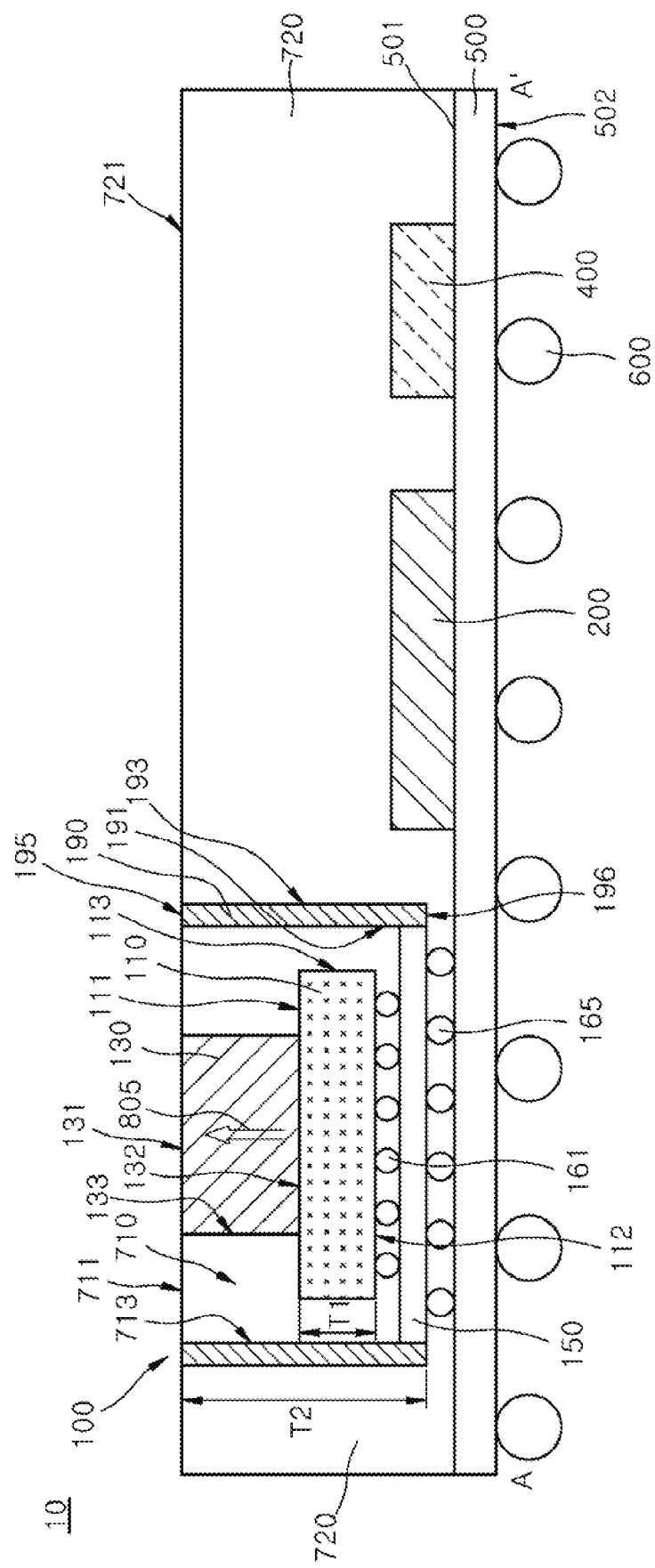
FIG. 2 is a cross-sectional view taken along a line A-A' of FIG. 1.
Figure 3:
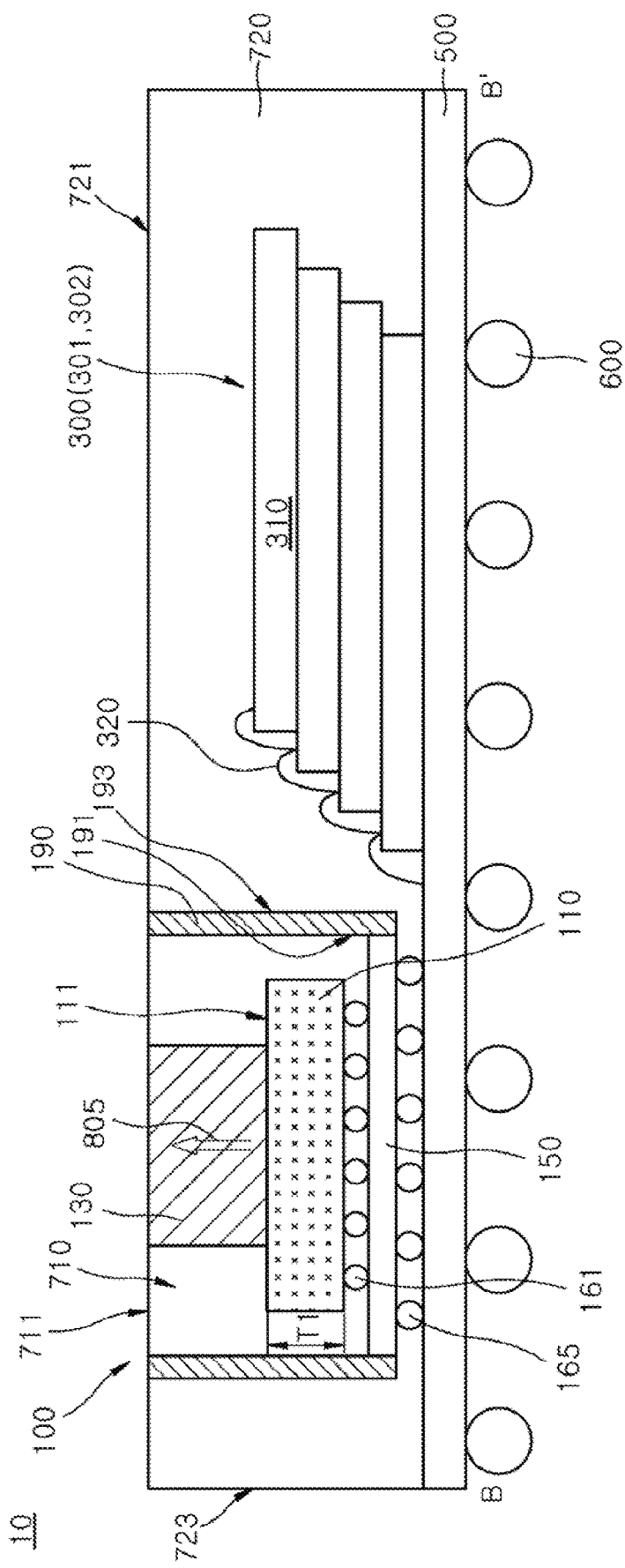
FIG. 3 is a cross-sectional view taken along a line B-B' of FIG. 1.
Figure 4:
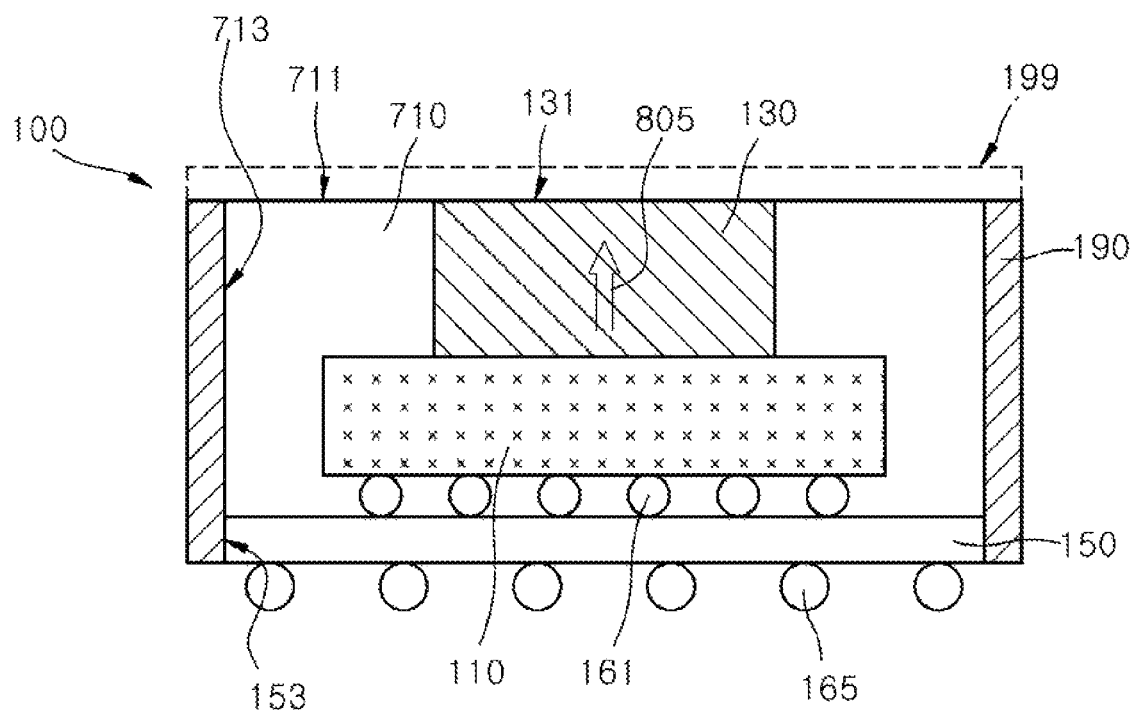
FIG. 4 is a cross-sectional view illustrating a built-in package embedded in the semiconductor package of FIG. 1.
Figure 5:
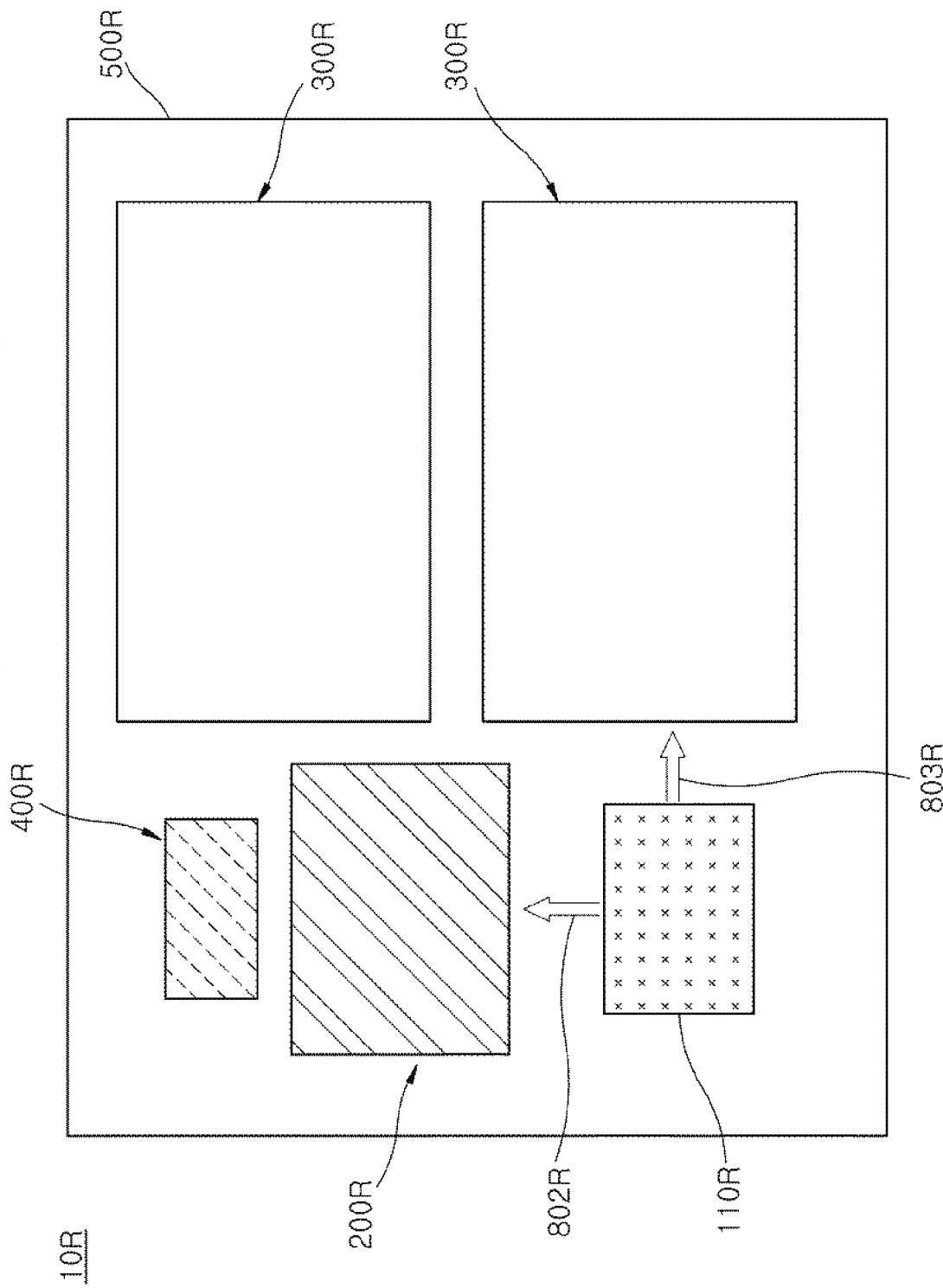
FIG. 5 is a plan view illustrating a general semiconductor package without a heat insulation wall as a comparative example.

FIG. 1 illustrates a plan view of a semiconductor package 10 according to an embodiment. FIG. 2 is a cross-sectional view taken along a line A-A' of FIG. 1, and FIG. 3 is a cross-sectional view taken along a line B-B' of FIG. 1. FIG. 4 illustrates a cross-sectional view of a built-in package 100 embedded in the semiconductor package 10 of FIG. 1. FIG. 5 is a plan view illustrating a general semiconductor package 10R without a heat insulation wall as a comparative example.

Referring to FIG. 1, the semiconductor package 10 may be configured to have a multi-chip package (MCP) shape or a ball grid array solid state drive (BGA SSD) package shape. The semiconductor package 10 may be configured to include a plurality of semiconductor chips 110, 200, 300, and 400. The semiconductor chips 110, 200, 300, and 400 may have different functions.

If the semiconductor package 10 is configured to have a BGA SSD package shape, the first semiconductor chip 110 may correspond to a controller chip. In such a case, the second semiconductor chip 200 may include a buffer memory, and the third semiconductor chip 300 may include a nonvolatile memory constituting an SSD. The first semiconductor chip 110 corresponding to a controller chip may be configured to control overall operations of the semiconductor package 10 having a BGA SSD package shape. The controller chip (i.e., the first semiconductor chip 110) may be a system-on-chip. The controller chip 110 may include a logic device that controls operations of the buffer memory (i.e., the second semiconductor chip 200) and the nonvolatile memory (i.e., the third semiconductor chip 300).

The fourth semiconductor chip 400 may include a power management integrated circuit (PMIC) device. The second semiconductor chip 200 may include a volatile memory, for example, a DRAM device acting as buffer memory. The buffer memory may temporarily store data to be written into the nonvolatile memory (i.e., the third semiconductor chip 300). That is, the data may be substantially stored in the nonvolatile memory (i.e., the third semiconductor chip 300). The nonvolatile memory (i.e., the third semiconductor chip 300) may be realized using a NAND-type memory device. The third semiconductor chip 300 may include a plurality of stacks, for example, a first stack 301 and a second stack 302 to increase a data storage capacity of the third semiconductor chip 300.

The first to fourth semiconductor chips 110, 200, 300, and 400 may be mounted on a first package substrate 500. The first to fourth semiconductor chips 110, 200, 300, and 400 may be disposed on a top surface 501 of the first package substrate 500. The first to fourth semiconductor chips 110, 200, 300, and 400 may be disposed on the top surface 501 of the first package substrate 500, where the first to fourth semiconductor chips 110, 200, 300, and 400 may be spaced apart from each other. Further, the second to fourth semiconductor chips 200, 300, and 400 may be spaced apart from the built-in package 100. Still further, at least the first semiconductor chip 110 and the second semiconductor chip 200 may be disposed side-by-side on the surface of the package substrate 500.

The first semiconductor chip 110 acting as the controller chip may operate with a relatively high driving voltage and may generate a relatively large amount of heat during operation. That is, the first semiconductor chip 110 may be a high power semiconductor chip. In contrast, the second or third semiconductor chip 200 or 300 may be a low power semiconductor chip that generates a relatively small amount of heat. For example, the first semiconductor chip 110 acting as the controller chip may consume electric power of approximately 1.5 watts while the second semiconductor chip 200 including a DRAM device may consume electric power of approximately 0.15 watts. Further, the first semiconductor chip 110 may generate a larger amount of heat than the second semiconductor chip and third semiconductor chip 200 and 300.

Referring to FIGS. 1 and 2, a heat insulation wall 190 may be disposed between the first semiconductor chip 110 and the second semiconductor chip 200. The heat insulation wall 190 may be introduced into the semiconductor package 10 to thermally isolate the second semiconductor chip 200 from the first semiconductor chip 110. As illustrated in FIG. 3, the heat insulation wall 190 may extend to thermally isolate the third semiconductor chip 300 from the first semiconductor chip 110.

Referring to FIG. 5, the general semiconductor package 10R may be illustrated as a comparative example and may be configured without the heat insulation wall 190. A first semiconductor chip 110R may be disposed on a package substrate 500R. A second semiconductor chip 200R, a third semiconductor chip 300R, and a fourth semiconductor chip 400R may be disposed at a periphery region of the first semiconductor chip 110R. The first semiconductor chip 110R may be a high power device that generates a relatively large amount of heat during operation.

The heat generated by the first semiconductor chip 110R may be conducted to the second and third semiconductor chips 200R and 300R, which are disposed along a first heat conduction path 802R and a second heat conduction path 803R at a periphery region of the first semiconductor chip 110R. Thus, the temperature of the second and third semiconductor chips 200R and 300R may undesirably rise due to heat generated by the first semiconductor chip 110R.

The heat conducted to the second semiconductor chip 200R may degrade characteristics of the second semiconductor chip 200R. That is, the characteristics of a DRAM device constituting the second semiconductor chip 200R may be degraded due to heat conducted to the second semiconductor chip 200R. For example, transistors in the DRAM device constituting the second semiconductor chip 200R may be heated by heat generated from the first semiconductor chip 110R to degrade a refresh characteristic, an operation speed, and reliability of the DRAM device. If a temperature of the DRAM device rises, a cycle time of a refresh operation for preventing loss of cell data of the DRAM device may be reduced to cause an increase in the number of times that a refresh operation is performed.

In addition, the heat conducted to the third semiconductor chip 300R may degrade characteristics of a NAND-type memory device constituting the third semiconductor chip 300R. For example, if a temperature of the NAND-type device rises, data retention characteristic and the reliability of the NAND-type device may be degraded.

Referring again to FIGS. 1 and 2, the heat insulation wall 190 may extend to surround a periphery of the first semiconductor chip 110, as illustrated in FIG. 1. The heat insulation wall 190 may have a rectangular closed loop shape to surround the first semiconductor chip 110 when viewed from a plan view. Thus, the heat insulation wall 190 may interrupt heat generated from operation of the first semiconductor chip 110 that is conducted to the second and third semiconductor chips 200 and 300 through heat conduction paths corresponding to the first and second heat conduction paths 802R and 803R illustrated in FIG. 5. That is, the heat insulation wall 190 may be disposed to block heat conduction from the first semiconductor chip 110 toward a periphery region of the first semiconductor chip 110.

Because heat conduction from the first semiconductor chip 110 toward a periphery region of the first semiconductor chip 110 is suppressed by the heat insulation wall 190, the heat insulation wall 190 may prevent characteristics of the second and third semiconductor chips 200 and 300 from being degraded due to a temperature increase of the second and third semiconductor chips 200 and 300.

Referring to FIG. 2, the heat insulation wall 190 may be disposed such that inner side surfaces 191 of the heat insulation wall 190 face side surfaces 113 of the first semiconductor chip 110. The inner side surfaces 191 of the heat insulation wall 190 may be in contact with side surfaces 713 of a first molding layer 710 that covers the side surfaces 113 of the first semiconductor chip 110. Gap regions between the heat insulation wall 190 and the side surfaces 113 of the first semiconductor chip 110 may be filled with portions of the first molding layer 710. One of outer side surfaces 193 of the heat insulation wall 190 may face the second semiconductor chip 200. The outer side surfaces 193 of the heat insulation wall 190 may be in contact with a second molding layer 720. Another one of the outer side surfaces 193 of the heat insulation wall 190 may face the third semiconductor chip 300, as illustrated in FIG. 3.

The heat insulation wall 190 may be disposed over a top surface 501 of the first package substrate 500 and may upwardly extend such that an upper end 195 of the heat insulation wall 190 is located at the same level as a top surface 711 of the first molding layer 710. The heat insulation wall 190 may upwardly extend to reach a top surface 721 of the second molding layer 720. The top surface 711 of the first molding layer 710 may be located at substantially the same level as the top surface 721 of the second molding layer 720. The heat insulation wall 190 may extend to have a height T2 which is greater than a thickness T1 of the first semiconductor chip 110, where the heat insulation wall 190 may extend in a same direction as a normal line which is orthogonal to the top surface 501 of the first package substrate 500. For example, the upper end 195 of the heat insulation wall 190 may be exposed at an interface between the top surfaces 711 and the 721 of the first and second molding layers 710 and 720. A lower end 196 of the heat insulation wall 190 opposite to the upper end 195 may be located at a level which is lower than a bottom surface 112 of the first semiconductor chip 110.

The heat insulation wall 190 may vertically extend such that the lower end 196 of the heat insulation wall 190 is located at a level which is lower than the bottom surface 112 of the first semiconductor chip 110, and the upper end 195 of the heat insulation wall 190 is located at a level which is higher than a top surface 111 of the first semiconductor chip 110. Because a total area of the inner side surfaces 191 of the heat insulation wall 190 is greater than a total area of the side surfaces 113 of the first semiconductor chip 110, the heat insulation wall 190 may efficiently block heat which is conducted from the first semiconductor chip 110 toward the second and third semiconductor chips 200 and 300.

The second molding layer 720 may be disposed on the top surface 501 of the first package substrate 500 to cover the second, third, and fourth semiconductor chips 200, 300, and 400. The first molding layer 710 may be disposed to cover at least a portion of the first semiconductor chip 110. Each of the first and second molding layers 710 and 720 may include a protection material, for example, an epoxy molding compound (EMC) material to protect the first to fourth semiconductor chips 110, 200, 300, and 400 from an external environment. The lower end 196 of the heat insulation wall 190 may be spaced apart from the top surface 501 of the first package substrate 500. The second molding layer 720 may extend to fill a gap between the lower end 196 of the heat insulation wall 190 and the top surface 501 of the first package substrate 500.

The heat insulation wall 190 may include a heat insulating material having a thermal conductivity which is lower than a thermal conductivity of the first and second molding layers 710 and 720. For example, the heat insulation wall 190 may include a heat insulating material having a thermal conductivity of approximately 0.02 W/mK to approximately 0.60 W/mK. The heat insulation wall 190 may include a heat insulating material having a thermal conductivity of at most 0.4 W/mK. In some embodiments, the heat insulation wall 190 may include an inorganic heat insulating material or an organic heat insulating material. The inorganic heat insulating material may include powdered magnesium carbonate, powered magnesia, calcium silicate, or the like, and the organic heat insulating material may include polyurethane foam, polystyrene foam, or the like. Alternatively, the heat insulation wall 190 may include a silica aerogel material.

Referring again to FIGS. 1 and 2, the heat insulation wall 190 may be disposed to surround the side surfaces 113 of the first semiconductor chip 110. Thus, heat generated by operation of the first semiconductor chip 110 may be kept substantially in a space surrounded by the heat insulation wall 190. Thus, a heat conductor 130 acting as a heat radiator may be disposed on the first semiconductor chip 110 to provide a heat conduction path that conducts heat generated by the first semiconductor chip 110 to an outside region of the semiconductor package 10.

The heat conductor 130 may be attached to the first semiconductor chip 110 such that a bottom surface 132 of the heat conductor 130 is in contact with the top surface 111 of the first semiconductor chip 110. A top surface 131 of the heat conductor 130 opposite to the first semiconductor chip 110 may be exposed to an outside region of the semiconductor package 10. Thus, the heat conductor 130 may constitute a third heat conduction path 805 that transmits heat generated by the first semiconductor chip 110 to an outside region of the semiconductor package 10. As a result, heat generated by the first semiconductor chip 110 may be efficiently emitted to an outside region of the semiconductor package 10 through the third heat conduction path 805.

Referring to FIG. 3, each of the first and second stacks 301 and 302 constituting the third semiconductor chip 300 may include a plurality of third semiconductor dies 310 which are vertically stacked to increase a data storage capacity of the third semiconductor chip 300. The third semiconductor dies 310 may be vertically stacked to provide the first or second stack 301 or 302 having a stairway structure. The third semiconductor dies 310 in each of the first and second stacks 301 and 302 may be electrically connected to the first package substrate 500 through bonding wires 320.

The heat conductor 130 may substantially penetrate the first molding layer 710 to act as the third heat conduction path 805 that extends from the top surface 111 of the first semiconductor chip 110 to the top surface 711 of the first molding layer 710. The heat conductor 130 may be formed to include a material having a thermal conductivity which is higher than a thermal conductivity of the first molding layer 710. The heat conductor 130 may be formed to include at least one of various heat conductive materials.

The heat conductor 130 may be formed by attaching a dummy chip to the first semiconductor chip 110. The dummy chip corresponding to the heat conductor 130 may be a semiconductor dummy chip, for example, a silicon dummy chip without any integration circuit. A semiconductor material (e.g., a silicon material) of the heat conductor 130 may have a thermal conductivity which is higher than a thermal conductivity of an EMC material of the first molding layer 710. Thus, heat generated by the first semiconductor chip 110 may be efficiently emitted through the heat conductor 130. A silicon dummy chip used as the heat conductor 130 may have a relatively high thermal conductivity of approximately 149 W/mK. In contrast, an EMC material of the first molding layer 710 may have a thermal conductivity of approximately 3 W/mK which is lower than a thermal conductivity of the heat conductor 130. If the heat conductor 130 is a silicon dummy chip and the first semiconductor chip 110 is a silicon chip, the heat conductor 130 and the first semiconductor chip 110 may have substantially the same coefficient of thermal expansion. In such a case, even though the first semiconductor chip 110 is heated by operation, no thermal stress is created at an interface between the heat conductor 130 and the first semiconductor chip 110. As a result, the first semiconductor chip 110 does not suffer from defects such as cracks.

Although not shown in the drawings, a thermal interface material layer may be disposed between the heat conductor 130 and the first semiconductor chip 110 to improve heat conduction efficiency between the heat conductor 130 and the first semiconductor chip 110.

Referring again to FIG. 2, the first semiconductor chip 110 may be disposed on the first package substrate 500 and may be embedded in the built-in package 100. The built-in package 100 may be configured to include a second package substrate 150 disposed over the first package substrate 500, the first semiconductor chip 110 mounted on a surface of the second package substrate 150, and the first molding layer 710 covering and protecting the first semiconductor chip 110, as illustrated in FIGS. 2 and 4. The first and second molding layers 710 and 720 may be formed to include substantially the same material. Even though the first and second molding layers 710 and 720 are respectively formed at two different molding steps, the first and second molding layers 710 and 720 may constitute a molding layer of the semiconductor package 10.

Referring to FIGS. 2 and 4, the second package substrate 150 may include an interconnection member to electrically connect the first semiconductor chip 110 to the first package substrate 500. The second package substrate 150 may be a printed circuit board (PCB). The first semiconductor chip 110 and the second package substrate 150 may be electrically connected to each other through first ball connectors 161. The first and second package substrates 500 and 150 may be electrically connected to each other through second ball connectors 165.

Referring to FIG. 4, the heat insulation wall 190 may be formed by depositing a heat insulation film or a heat insulation layer on the side surfaces 713 (corresponding to side surfaces of the built-in package 100) of the first molding layer 710 and the top surface 711 (corresponding to a top surface of the built-in package 100) of the first molding layer 710 and by removing a portion 199 of the heat insulation film or the heat insulation layer to expose the top surface 711 of the first molding layer 710. The heat insulation wall 190 may cover the side surfaces 713 (corresponding to side surfaces of the built-in package 100) of the first molding layer 710 and may extend to cover side surfaces 153 of the second package substrate 150. Thus, the heat insulation wall 190 may extend to surround all side surfaces of the built-in package 100. As a result of removing the portion 199 of the heat insulation film or the heat insulation layer, the heat insulation wall 190 may be formed to leave the top surface 711 (corresponding to a top surface of the built-in package 100) of the first molding layer 710 exposed.

Referring again to FIG. 2, the heat insulation wall 190 may be disposed between the second molding layer 720 and the side surfaces 713 of the first molding layer 710. In other words, the second molding layer 720 may leave exposed the top surface 711 of the first molding layer 710. The top surface 131 of the heat conductor 130 may also be exposed at the top surface 711 of the first molding layer 710. The heat conductor 130 may be disposed to substantially penetrate a portion of the first molding layer 710 to contact the top surface 111 of the first semiconductor chip 110.

The second package substrate 150 of the built-in package 100 may suppress heat conduction from the first semiconductor chip 110 to the first package substrate 500. The second package substrate 150 may include an organic material having a relatively low thermal conductivity. Thus, the second package substrate 150 may more effectively suppress heat conduction from the first semiconductor chip 110 to the second and third semiconductor chips 200 and 300.

Meanwhile, the second ball connectors 165 may be attached to the top surface 501 of the first package substrate 500, and third ball connectors 600 may be attached to a bottom surface 502 of the first package substrate 500 opposite the second ball connectors 165. The third ball connectors 600 may act as connection members that electrically connect the semiconductor package 10 to an external device or an external system.

According to the embodiments described above, a heat insulation wall may be disposed in a semiconductor package to thermally isolate a high power semiconductor chip included in the semiconductor package from at least one low power semiconductor device included in the semiconductor package.

Figure 6:
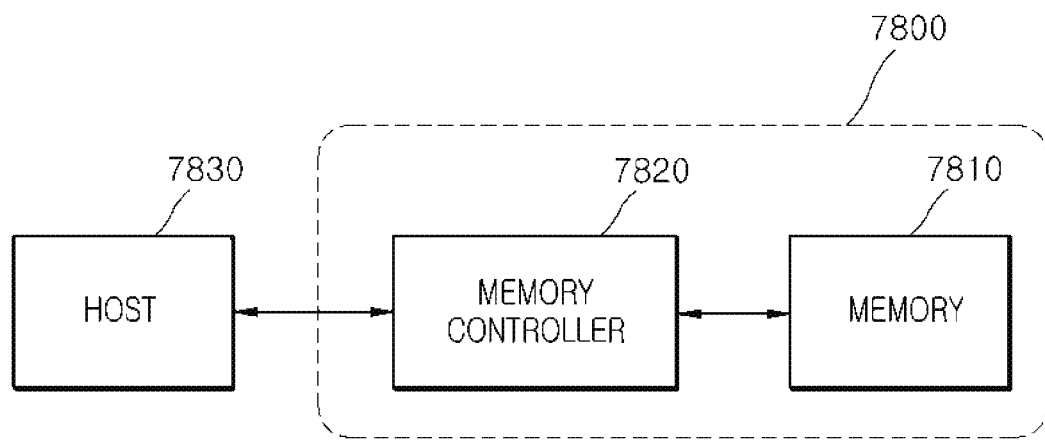
FIG. 6 is a block diagram illustrating an electronic system employing a memory card including a semiconductor package according to an embodiment.

FIG. 6 is a block diagram illustrating an electronic system including a memory card 7800 employing at least one of the semiconductor packages according to embodiments. The memory card 7800 may include a memory 7810 such as a nonvolatile memory device, and a memory controller 7820. The memory 7810 and the memory controller 7820 may store data or read out the stored data. At least one of the memory 7810 and the memory controller 7820 may include at least one of the semiconductor packages according to the embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 7:
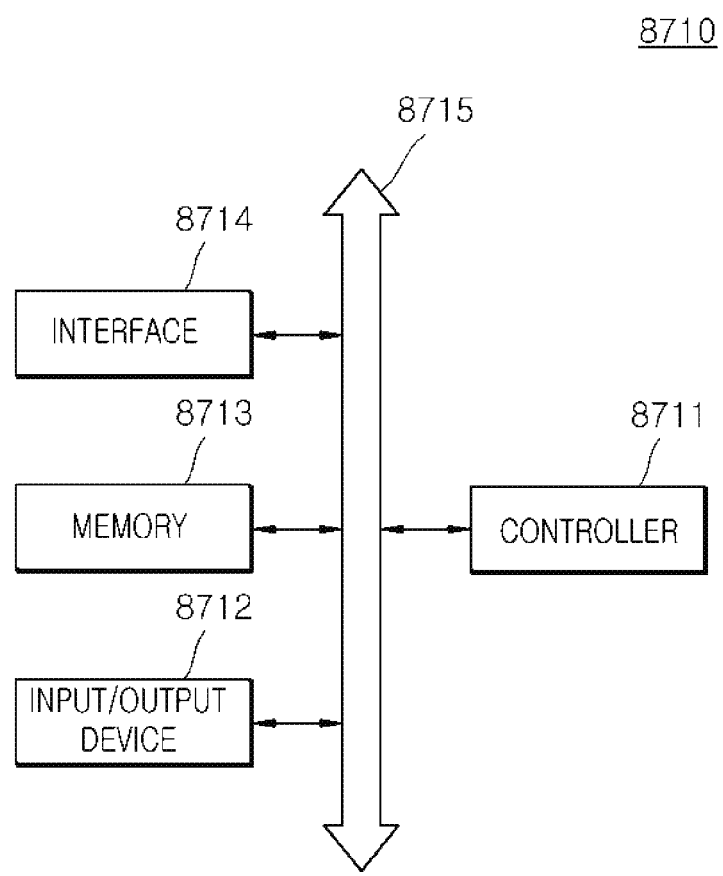
FIG. 7 is a block diagram illustrating another electronic system including a semiconductor package according to an embodiment.

FIG. 7 is a block diagram illustrating an electronic system 8710 including at least one of the semiconductor packages according to the embodiments. The electronic system 8710 may include a controller 8711, an input/output unit 8712, and a memory 8713. The controller 8711, the input/output unit 8712 and the memory 8713 may be coupled with one another through a bus 8715 providing a path through which data move.

In an embodiment, the controller 8711 may include one or more of a microprocessor, digital signal processor, microcontroller, and/or logic device capable of performing the same functions as these components. The controller 8711 or the memory 8713 may include at least one of the semiconductor packages according to the embodiments of the present disclosure. The input/output unit 8712 may include at least one selected from a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is equipment capable of performing wireless communications, the electronic system 8710 may be used in a communication system using a technique such as CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor package comprising:
    a first package substrate;
    a built-in package disposed on the first package substrate comprising:
        a second package substrate;
        a first semiconductor chip disposed over the second package substrate;
        a heat insulation wall for thermally isolating the first semiconductor chip;
        a second semiconductor chip disposed on the first package substrate to be spaced apart from the built-in package;
        a first molding layer filling a gap between the first semiconductor chip and the heat insulation wall; and
        a heat conductor in contact with the first semiconductor chip and exposed on a surface of the first molding layer.

2. The semiconductor package of claim 1, wherein the heat insulation wall includes a heat insulating material having a thermal conductivity which is lower than a thermal conductivity of the first molding layer.

3. The semiconductor package of claim 2, wherein the heat insulation wall has a thermal conductivity of 0.4 W/mK or less.

4. The semiconductor package of claim 1, wherein the heat conductor includes a material having a thermal conductivity which is higher than a thermal conductivity of the first molding layer.

5. The semiconductor package of claim 4, wherein the heat conductor includes a silicon dummy chip.

6. The semiconductor package of claim 1, further comprising a second molding layer that covers the first package substrate and the second semiconductor chip and exposes a top surface of the first molding layer.

7. The semiconductor package of claim 6, wherein the heat insulation wall extends such that an upper end of the heat insulation wall is exposed at a top surface of the second molding layer.

8. The semiconductor package of claim 6, wherein the heat insulation wall is disposed between the second molding layer and at least one side surface of the first semiconductor chip.

9. The semiconductor package of claim 1, wherein the heat insulation wall extends such that a lower end of the heat insulation wall is located at a level which is lower than a bottom surface of the first semiconductor chip.

10. The semiconductor package of claim 1, wherein the heat insulation wall extends to surround all side surfaces of the first semiconductor chip.

11. The semiconductor package of claim 1, wherein the first semiconductor chip is a high power chip generating a larger amount of heat than the second semiconductor chip, where the second semiconductor chip is a low power chip.

* * * * *